(12) United States Patent
Lee (10) Patent No.: US 8,882,294 B2
(45) Date of Patent: Nov. 11, 2014

(54) LIGHT EMITTING DEVICE PACKAGE

(75) Inventor: JooSeok Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 593 days.

(21) Appl. No.: 13/177,853

(22) Filed: Jul. 7, 2011

(65) Prior Publication Data

US 2012/0008322 A1   Jan. 12, 2012

(30) Foreign Application Priority Data

Jul. 8, 2010   (KR) ........................ 10-2010-0065980

(51) Int. Cl.
| | | |
|---|---|---|
| *F21V 15/01* | (2006.01) | |
| *H01L 33/48* | (2010.01) | |
| *F21Y 101/02* | (2006.01) | |
| *F21K 99/00* | (2010.01) | |

(52) U.S. Cl.
CPC ....... *H01L 33/486* (2013.01); *H01L 2924/0002* (2013.01); *F21Y 2101/02* (2013.01); *F21K 9/17* (2013.01); *Y10S 362/80* (2013.01)
USPC ...... 362/249.02; 362/632; 362/633; 362/634; 362/800; 257/678; 257/685; 257/690; 257/99; 257/723; 257/730

(58) Field of Classification Search
None
See application file for complete search history.

(56) References Cited

U.S. PATENT DOCUMENTS

| | | | | |
|---|---|---|---|---|
| 5,660,461 | A * | 8/1997 | Ignatius et al. | ............... 362/241 |
| D497,349 | S | 10/2004 | Hoshiba | ........................ D13/180 |
| 2011/0303944 | A1 | 12/2011 | Arndt | .............................. 257/99 |

FOREIGN PATENT DOCUMENTS

| | | |
|---|---|---|
| DE | 10 2008 048 259 A1 | 4/2010 |
| EP | 1 630 877 A2 | 3/2006 |
| JP | 2009-004546 A | 1/2009 |
| JP | 2009-170824 A | 7/2009 |
| JP | 2009-246068 A | 10/2009 |
| JP | 2010-103149 A | 5/2010 |
| KR | 10-2010-0050043 A | 5/2010 |
| WO | WO 2009/028861 A2 | 3/2009 |

OTHER PUBLICATIONS

Machine translation of claims for JP 2009-246068 to Panasonic (2009).*
Machine translatiopn for description for JP 2009-246068 to Panasonic (2009).*
Korean Notice of Allowance dated Apr. 10, 2012 issued in Application No. 10-2010-0065980.
Korean Office Acton dated Sep. 9, 2011 issued in Application No. 10-2010-0065980.
European Search Report dated Aug. 21, 2014 issued in Application No. 11173184.0.
Christoffers, K-E: "Praezisionskunstoffteile Gestaltung, Werkzeugauslegung und Verarbeitungsbedingungen", Feinwerktechnik + Messtechnik, Hanser, Munchen, DE, vol. 87, No. 6, Sep. 1, 1979, pp. 259-270 (XP-001173854).

* cited by examiner

*Primary Examiner* — Sharon Payne
(74) *Attorney, Agent, or Firm* — Ked & Associates, LLP (57) ABSTRACT

The light emitting device package may include a light emitting device including at least one light emitting diode and a body including at least one lead frame on which a light emitting device is disposed, the body provided a first protrusion formed on a outside of the body, wherein the width of a lower surface of the first protrusion is 0.5 times to 0.9 times the width of a upper surface of the first protrusion.

6 Claims, 6 Drawing Sheets

LIGHT EMITTING DEVICE PACKAGE

CROSS-REFERENCE TO RELATED APPLICATION

This application claims the priority benefit of Korean Patent Application No. 10-2010-0065980, filed on in Korea Jul. 8, 2010, the disclosure of which is incorporated herein by reference.

BACKGROUND OF THE EMBODIMENT

1. Field

This relates to a light emitting device package.

2. Background

A light emitting device may include, for example, a light emitting diode (LED) including a semiconductor device which converts electrical energy into light.

The light emitting diode is an element which converts an electrical signal into ultraviolet light or visible light using characteristics of a compound semiconductor, and is used in electric home appliances, remote controllers, electronic display boards, indicators, and various automatic machinery. LEDs are now finding an increasingly wide range of applications.

In generally, a small-sized LED is being produced as a surface mount device for direct mounting on a printed circuit board (PCB), and thus an LED lamp used as a display element is being developed as a surface mount device. Such a surface mount device may serve as a replacement for conventional simple lamps, and is used as a light indicator emitting light of various colors, a letter indicator and an image indicator.

As the application range of LEDs has been increased, as described above, brightness required by lamps in daily use, lamps for emergency signals and so on is increased and thus increase in brightness of light emitted from LEDs is important.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to exemplary embodiments, examples of which are illustrated in the accompanying drawings. wherever possible, the same reference numbers will be used throughout the drawings to refer to the same or like parts.

It may be understood that when an device such as a layer (film), a region, a pad or a pattern is referred to as being "on" or "under" another device, it may be directly or indirectly on or under the other device. Further, the "on" or "under" positioning of each layer will be described based on illustration in the drawings.

In the drawings, the thicknesses or sizes of respective layers may be exaggerated, omitted, or schematically illustrated for convenience and clarity of description. Therefore, the sizes of respective devices shown in the drawings do not necessarily denote the actual sizes thereof.

Further, angles and directions referred to during description of a structure of a light emitting device array may be described with reference to illustration in the drawings. In the description of the structure of the light emitting device array, if reference points with respect to the angles and positional relations are not clearly stated, the related drawings may be relied upon.

Figure 1:
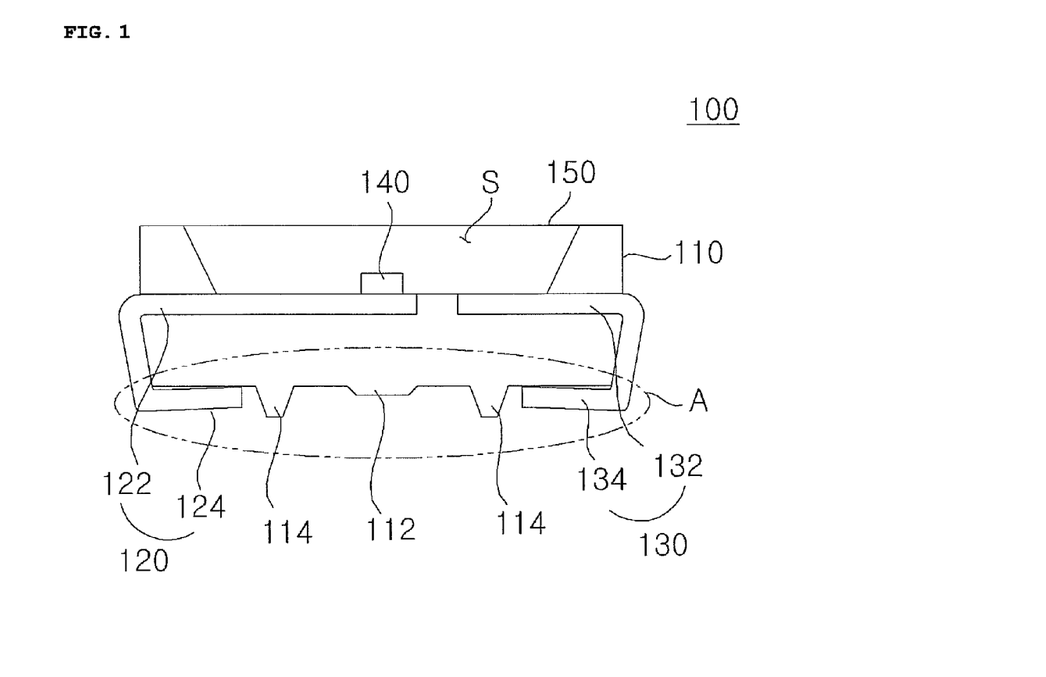
FIG. 1 is a cross-sectional view of a light emitting device package in accordance with an embodiment as broadly described herein.

FIG. 1 is a cross-sectional view of a light emitting device package in accordance with an embodiment as broadly described herein.

With reference to FIG. 1, a light emitting device package 100 as embodied and broadly described herein may include a body 110 in which a cavity S is formed, first and second lead frames 120 and 130 disposed within the body 110, and a light emitting device 140 disposed on the first lead frame 120 within the cavity S.

Here, the body 110 may be made of, for example, a resin material such as, for example, polyphthalamide (PPA), silicon (Si), aluminum (Al), aluminum nitride (AlN), aluminum oxide (AlOx), a liquid crystal polymer such as photo sensitive glass (PSG), polyamide 9T (PA9T), syndiotactic polystyrene (SPS), a metal, sapphire ($Al_2O_3$), beryllium oxide (BeO), a conductive ceramic, a printed circuit board (PCB) or various combination(s) thereof.

The body 110 may be formed by an injection molding or etching process, or other process as appropriate, but formation of the body 110 is not limited thereto.

Further, an upper surface of the body 110 may have various shapes including a triangular shape, a rectangular shape, a circular shape and so on according to purposes and designs of the light emitting device 140.

A cross-section of the cavity S may be formed in a cup shape or a depressed container shape, and an inner surface of the cavity S may be perpendicular or inclined with respect to the bottom of the cavity S.

Further, a front surface of the cavity S may have various shapes including a circular shape, a rectangular shape, a polygonal shape, an oval shape and so on, but is not limited thereto.

Here, the first and second lead frames 120 and 130 may be made of a metal, for example, at least one out of titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), or alloys thereof.

Further, the first and second lead frames 120 and 130 may have a monolayer or multilayer structure, but are not limited thereto.

Here, the first and second lead frames 120 and 130 respectively include first frame 122 and 132 disposed within the cavity S and second frame 124 and 134 disposed under the body 110.

That is, the light emitting device 140 may be disposed on one of the first frame 122 and 132 and electrodes (not shown) of the light emitting device 140 may be disposed on the first frame 122 and 132, but is not limited thereto.

Here, the second frame 124 and 134 are disposed under the body 110, and contact a copper film formed on a printed circuit board (not shown) to receive power.

The body 110 includes a first protrusion 112 made by injecting molding, in which a material is injected into a mold, and second protrusions 114 to support the body 110 if the first and second lead frames 120 and 130 contact the printed circuit board. The first protrusion 112 and the second protrusions 114 are formed on a outside of the body 110.

Here, the first protrusion 112 has the same shape as an inlet of the mold through which the material is injected into the mold, and is separated from the mold after injection molding has been completed.

A detailed description of the first protrusion 112 and the second protrusions 114 will be given later.

The cavity S is filled with a sealant 150, and the sealant 150 may achieve double-molding or triple-molding. The sealant 150 may be made of silicon which includes a phosphor (not shown) or silicon which does not include the phosphor, but is not limited thereto.

Figure 2:
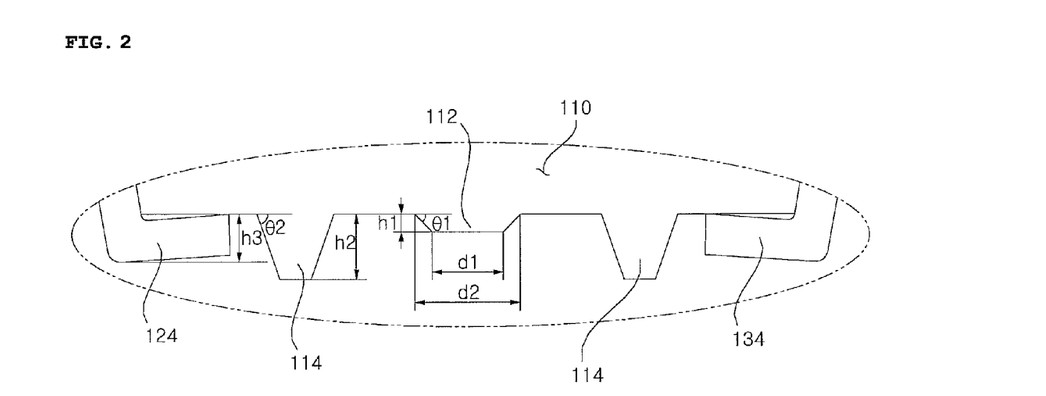
FIG. 2 is an enlarged view of the portion 'A' shown in FIG. 1.

FIG. 2 is an enlarged view of the portion 'A' shown in FIG. 1.

FIG. 2 illustrates the lower portion of the body 110.

With reference to FIG. 2, the first protrusion 112 may be formed to have a first height h1, the second protrusions 114 may be formed to have a second height h2, and the second frame 124 of the first lead frame 120 may be formed to have a third height h3.

It should be understood that first, second and third heights h1, h2 and h3 are measured from the lower surface of the body 110.

Although FIG. 2 illustrates the first height h1 as being lower than the second and third heights h2 and h3, the first height h1 may be equal to the second height h2 and in this case, the first protrusion 112 may support the body 110 in the same manner as the second protrusions 114.

Here, the second height h2 is higher than the third height h3, and thus, when the second frame 124 and 134 contact the printed circuit board (not shown), the second protrusions 114 may support the body 110.

The third height h3 means the height of a higher one out of the second frame 124 and 134 of the first and second lead frames 120 and 130, and the heights of the second frame 124 and 134 may be equal to each other.

Here, a first inclination angle θ1 between an upper surface and a lower surface of the first protrusion 112 is preferably 50 degrees to 89 degrees, or a width d1 of the lower surface of the first protrusion 112 is preferably 0.5 times to 0.9 times a width d2 of the upper surface of the first protrusion 112.

That is, if the first inclination angle θ1 of the first protrusion 112 is not more than 50 degrees, an inclined plane of the first protrusion 112 increases and the width d1 of the lower surface of the first protrusion 112 decreases, and thus a degree to which the body 110 is supported may be lowered and formation of the first protrusion 112 which is thicker than the first and second frame 122, 132 and 124, 134 may be difficult. On the other hand, if the first inclination angle θ1 of the first protrusion 112 is more than 90 degrees, separation of the body 110 from the mold after injection molding has been completed may be difficult.

Further, if the width d1 of the lower surface of the first protrusion 112 is not more than 0.5 times the width d2 of the upper surface of the first protrusion 112, the degree to which the body 110 is supported may be lowered, and if the width d1 of the lower surface of the first protrusion 112 is more than 1 times the width d2 of the upper surface of the first protrusion 112, separation of the body 110 from the mold after injection molding has been completed may be difficult.

As described above, the width d1 of the lower surface of the first protrusion 112 is at most 0.5 times the width d2 of the upper surface of the first protrusion 112 due to the first height h1, and the width d1 of the lower surface and the width d2 of the upper surface of the first protrusion 112 may be determined by the first height h1 and the first inclination angle θ1.

Here, the first inclination angle θ1 may be equal to a second inclination angle θ2 between an upper surface and a lower surface of the support protrusion 114 or be smaller than the second inclination angle θ2, but is not limited thereto.

Although this embodiment illustrates that a side surface between the upper surface and the lower surface of the first protrusion 112 does not have curvature, the side surface may have curvature, but is not limited thereto.

Figure 3:
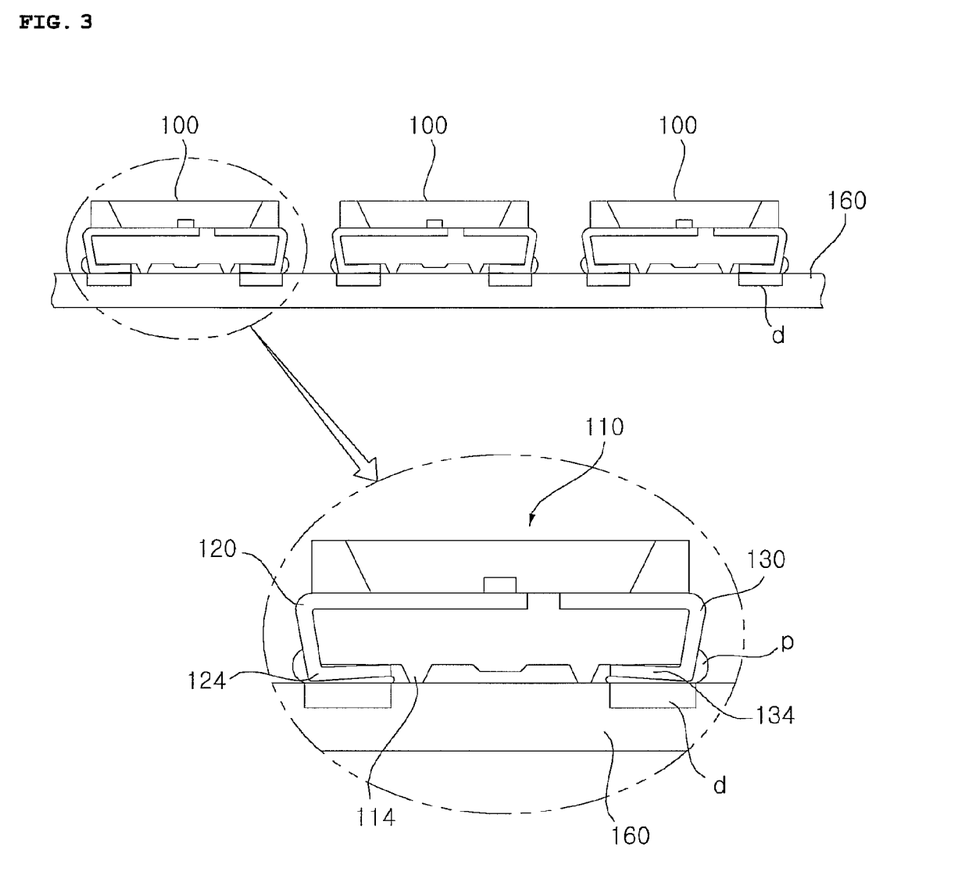
FIG. 3 is a cross-sectional view illustrating the light emitting device package shown in FIG. 1 contacting a printed circuit board.

FIG. 3 is a cross-sectional view illustrating the light emitting device package shown in FIG. 1 contacting a printed circuit board.

FIG. 3 illustrates a light emitting device package array in which a plurality of light emitting device packages 100 is disposed on a pattern of a copper film d of a printed circuit board 160.

With reference to FIG. 3, each of the plurality of light emitting device package 100 is configured such that the second protrusions 114 formed on the lower surface of the body 110 contact the printed circuit board 160 at positions adjacent to the copper film d so as to support the body 110 while the first and second lead frames 120 and 130 are separated from or contact the copper film d.

That is, the second protrusions 114 prevent the body 110 from being warped or inclined prior to soldering between the copper film d and the second frame 124 and 134 of the first and second lead frames 120 and 130 and allow the body 110 to be stably disposed.

Thereafter, when soldering has been completed, a soldering material p is disposed between the second frame 124 and 134 and the copper film d, thereby preventing cold soldering between the second frame 124 and 134 and the copper film d.

Figure 4:
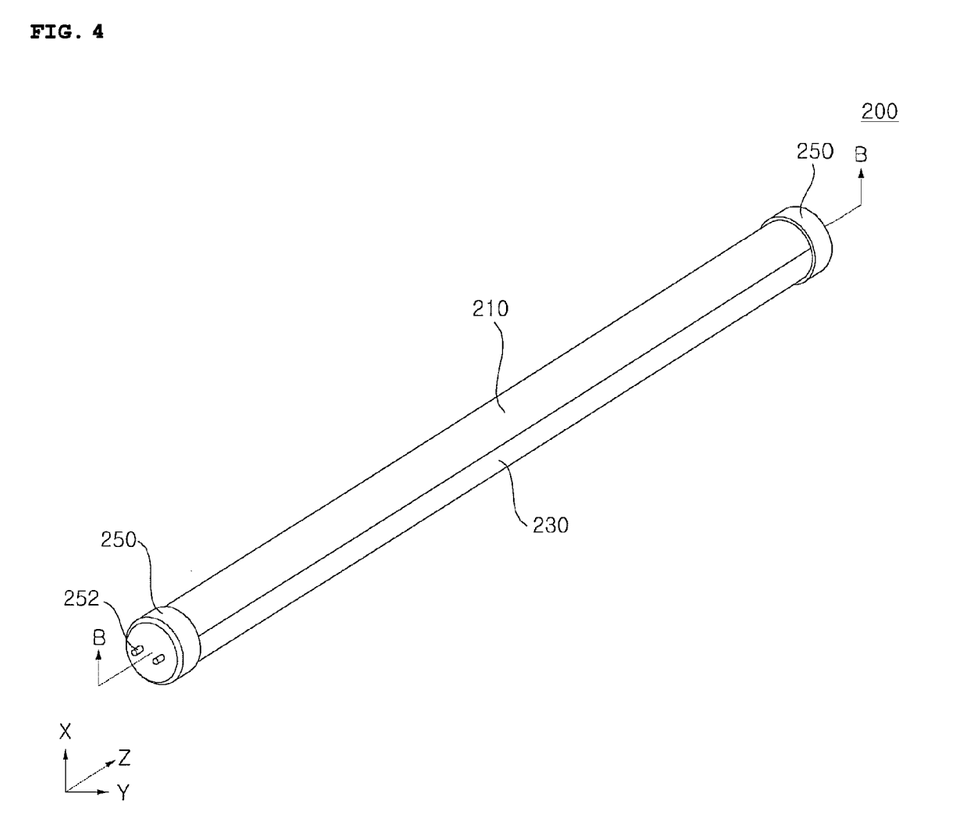
FIG. 4 is a perspective view of a lighting apparatus including light emitting element packages in accordance with an embodiment as broadly described herein.
Figure 5:
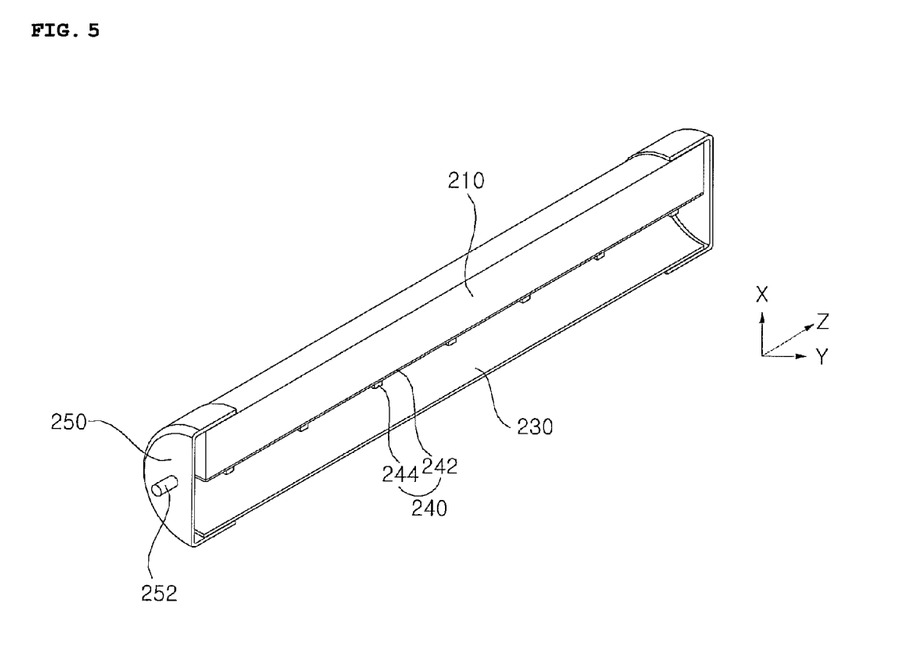
FIG. 5 is a cross-sectional view of the lighting apparatus taken along the line B-B show in FIG. 4.

FIG. 4 is a perspective view of a lighting apparatus including light emitting element packages in accordance with an embodiment as broadly described herein and FIG. 5 is a cross-sectional view of the lighting apparatus taken along the line B-B show in FIG. 4.

In order to describe a shape of the lighting apparatus in accordance with this embodiment in more detail, a length direction Z of the lighting apparatus, a horizontal direction Y which is perpendicular to the lengthwise direction Z and a height direction X which is perpendicular to the length direction Z and the horizontal direction Y will be described.

That is, FIG. 5 is a cross-sectional view of a lighting apparatus 200 shown in FIG. 4 taken in the length direction Z and the height direction X and seen in the horizontal direction Y.

With reference to FIGS. 4 and 5, the lighting apparatus 200 includes a body 210, a cover 230 coupled with the body 210, and end caps 250 located at both ends of the body 210.

A light emitting device module 240 is disposed on a lower surface of the body 210, and the body 210 may be made of a metal having excellent conductivity and heat dissipation so as to dissipate heat generated by light emitting device packages 244 to the outside through an upper surface of the body 210.

The light emitting device packages 244 emitting light of various colors may be mounted in multiple rows on a printed circuit board 242. The light emitting device packages 244 are mounted at the same separation distance or at various separation distances as needed, thereby being capable of adjusting brightness of the lighting apparatus 200. Further, in order to achieve effective heat dissipation, the printed circuit board 242 may be a metal board.

The cover 230 may be formed in a circular shape so as to surround the lower surface of the body 210, but the shape of the cover 230 is not limited thereto.

The cover 230 protects the light emitting device module 240 provided therein from external foreign substances. Further, as will described later, the cover 230 may include diffusion particles to prevent glaring due to light generated by the light emitting device packages 244 and to uniformly dissipate the heat to the outside. Moreover, a prism pattern may be formed on at least one of an internal surface and an external surface of the cover 230, and a phosphor may be applied to at least one of the internal surface and the external surface of the cover 230.

Since the heat generated by the light emitting device packages 244 is dissipated to the outside through the cover 230, the cover 230 needs to have excellent light transmittance and have sufficient heat resistance so as to withstand the heat generated by the light emitting device packages 244. Therefore, the cover 230 is preferably made of a material including polyethylene terephthalate (PET), polycarbonate (PC) or polymethyl methacrylate (PMMA).

The end caps 250 are located at both ends of the body 210 and may be used to seal a power supply device (not shown). Further, power pins 252 are formed on the end caps 250, and thus the lighting apparatus 200 in accordance with this embodiment may be inserted directly into terminals, from which a conventional fluorescent lamp is removed, without the need for any separate device.

Figure 6:
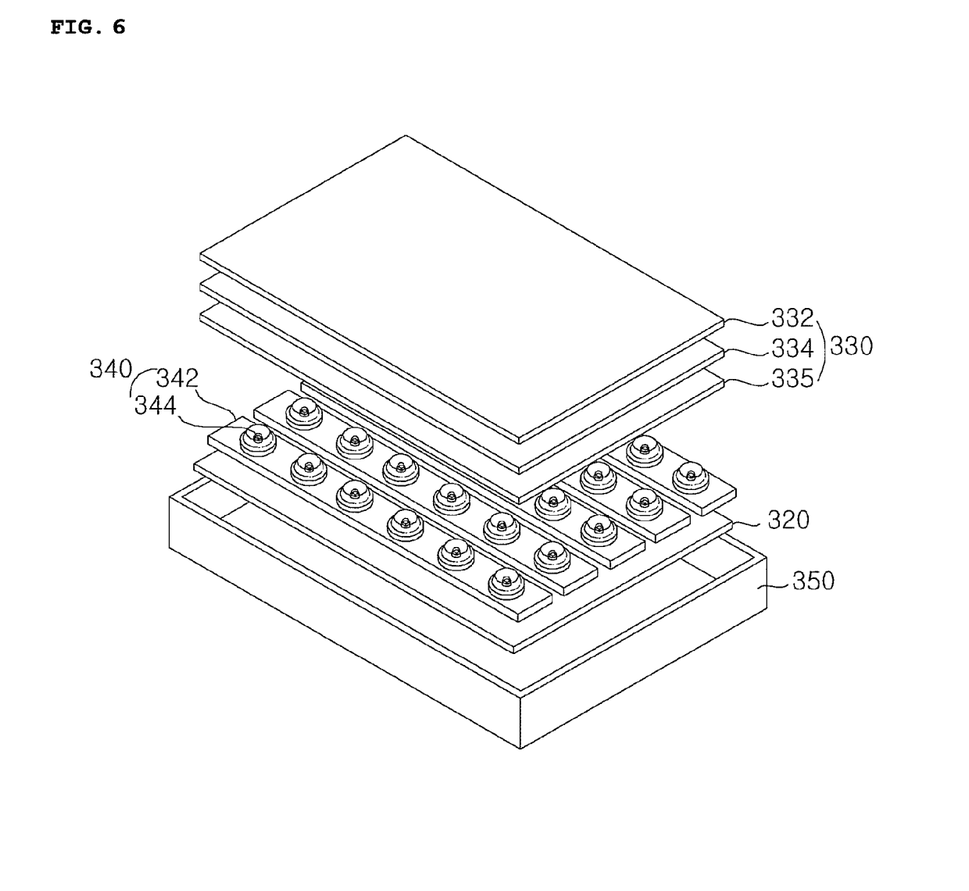
FIG. 6 is a perspective view of a backlight unit including an array of light emitting package devices in accordance embodiments as broadly described herein.

FIG. 6 is a perspective view of a backlight unit including an array of light emitting package devices in accordance embodiments as broadly described herein.

FIG. 6 illustrates a vertical type backlight unit. With reference to FIG. 6, the backlight unit includes a lower receiving member 350, a reflective plate 320, a plurality of light emitting device modules 340, and a plurality of optical sheets 330.

Here, each of the light emitting device modules 340 includes a printed circuit board 342 and an array of a plurality of light emitting device packages 344 mounted on the printed circuit board 342.

A plurality of protrusions is formed on the bottom surfaces of the light emitting device packages 344, thus improving a mixing effect of red light, green light and blue light.

The reflective plate 320 has high light reflectance, thus being capable of reducing optical loss. The optical sheets 330 may include at least one of a brightness enhancing sheet 332, a prism sheet 334 and a diffusion sheet 336.

The diffusion sheet 336 causes light incident from the light emitting device modules 340 to proceed toward the front surface of a liquid crystal display panel (not shown) and diffuses the light so as to achieve uniform distribution over a wide area and then to irradiate the light onto the liquid crystal display panel (not shown). The prism sheet 334 serves to convert inclined light out of the incident light into vertical light so as to emit the vertical light. That is, in order to convert inclined light out of light emitted from the diffusion sheet 336 into vertical light, at least one prism sheet 334 is disposed under the liquid crystal display panel (not shown). The brightness enhancing sheet 332 transmits light which is parallel with a transmission axis thereof and reflects light which is perpendicular to the transmission axis thereof.

Figure 7:
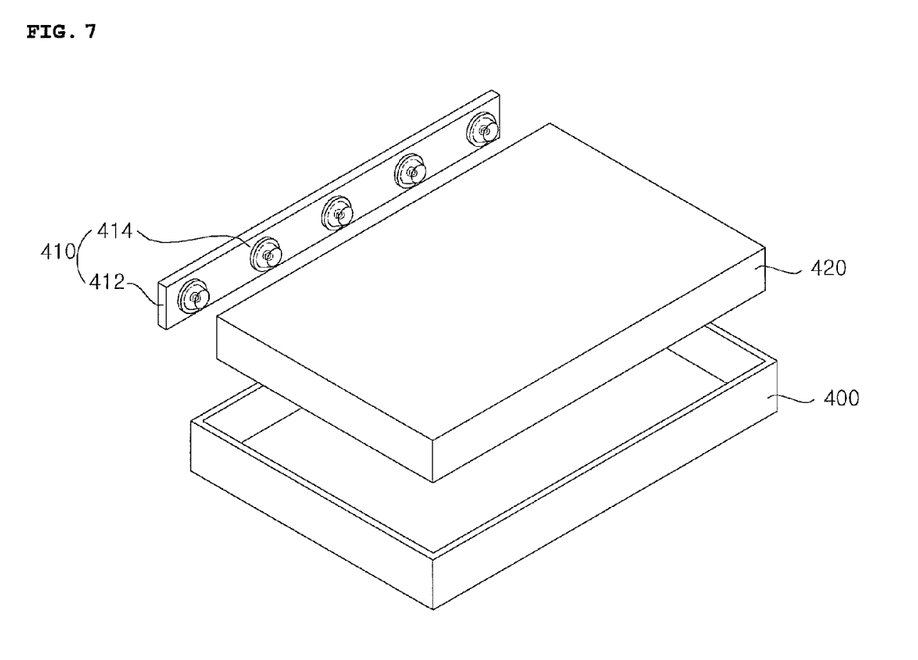
FIG. 7 is a perspective view of another backlight unit including an array of light emitting package devices in accordance with embodiments as broadly described herein.

FIG. 7 is a perspective view of another backlight unit including an array of light emitting package devices in accordance with embodiments as broadly described herein.

FIG. 7 illustrates an edge type backlight unit. With reference to FIG. 7, the backlight unit includes a lower receiving member 400, a light emitting device module 410 to output light, a light guide plate 420 disposed adjacent to the light emitting device module 410, and a plurality of optical sheets (not shown). The plurality of optical sheets (not shown) may be located on the upper surface of the light guide plate 420. The plurality of optical sheets (not shown) is the same as the plurality of optical sheets 330 described in FIG. 7 and a detailed description thereof will thus be omitted.

The light emitting device module 410 includes a printed circuit board 412 and an array of a plurality of light emitting device packages 414 mounted on the printed circuit board 812. A metal core PCB (MCPCB) or a PCB made of FR4 may be used as the printed circuit board 412. Further, the printed circuit board 412 may be manufactured to have various shapes in addition to a rectangular shape according to the structure of a backlight assembly.

The light guide plate 420 converts light emitted from the light emitting device packages 414 into surface light and then supplies the surface light to a liquid crystal display panel (not shown). The plurality of optical sheets (not shown) to uniformize a brightness distribution of light supplied from the light guide plate 420 and to improve a vertical incident property and a reflective sheet (not shown) to reflect light emitted from the rear portion of the light guide plate 420 back to the light guide plate 420 may be located on the rear surface of the light guide plate 420.

The structure of the vertical type backlight unit described and shown in FIG. 6 and the structure of the edge type backlight unit described and shown in FIG. 7 may be combined.

Here, a lighting system may include the lighting apparatus 200 and the backlight units 300 and 400. In addition, the lighting system may include any apparatus including light emitting device packages for the purpose of illumination.

As is apparent from the above description, a light emitting device package in accordance with an embodiment allows an first protrusion, formed on a lower surface of a body during formation of the body through injection molding, to have an upper surface and a lower surface having different widths so as to form an inclination angle, thereby allowing the body to be easily separated from a mold after injection molding has been completed.

Further, the light emitting device package in accordance with the embodiment allows second protrusions serving to support the body when the body is fixed to a printed circuit board to be formed on the body, thereby allowing the second protrusions to support the body during soldering of lead frames to the printed circuit board and thus preventing cold soldering between the lead frames and the printed circuit board.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
   a light emitting device including at least one light emitting diode; and
   a body including at least one lead frame on which a light emitting device is disposed, the body provided a first protrusion and a second protrusion formed on an outside of the body,
   wherein at least one of the width of a lower surface of the first protrusion and a second protrusion is 0.5 times to 0.9 times the width of an upper surface,
   wherein at least one of the first protrusion and the second protrusion has an inclination angle of 50 degrees to 89 degrees with respect to the lower surface of the body.

2. The light emitting device package of claim 1, wherein a side surface of the first protrusion between the upper surface and the lower surface has curvature.

3. The light emitting device package of claim 1, wherein each of the at least one lead frame including:
   a first frame on which the light emitting device is disposed; and
   a second frame connected to the first frame and disposed on the outside of the body,
   wherein the lower surface of the first protrusion is located so as not to be collinear with a lower surface of the second frame.

4. The light emitting device package of claim 1,
   wherein a lower surface of the second protrusion is located so as not to be collinear with the lower surface of the first protrusion.

5. The light emitting device package of claim 4, wherein each of the at least one lead frame including:
   a first frame on which the light emitting device is disposed; and
   a second frame connected to the first frame and disposed on the outside of the body,
   wherein the lower surface of the second protrusion is located so as not to be collinear with a lower surface of the second frame.

6. The light emitting device package of claim 5, wherein a height of the second protrusion is higher than a height of the lower surface of the second substrate from the lower surface of the body.

* * * * *